United States Patent
Wong

(10) Patent No.: US 6,558,992 B2
(45) Date of Patent: May 6, 2003

(54) METHOD TO FABRICATE FLAT PANEL DISPLAY

(75) Inventor: Jia-Fam Wong, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 10/139,922

(22) Filed: May 6, 2002

(65) Prior Publication Data

US 2002/0168789 A1 Nov. 14, 2002

(30) Foreign Application Priority Data

May 11, 2001 (TW) .......................... 90111286 A

(51) Int. Cl.[7] .......................... H01L 21/00; H01L 21/84
(52) U.S. Cl. .................. 438/151; 438/149; 438/160
(58) Field of Search .................. 438/149–166

(56) References Cited

U.S. PATENT DOCUMENTS

| | | | | |
|---|---|---|---|---|
| 5,477,355 A | * | 12/1995 | Sasaki et al. .................. | 349/4 |
| 5,733,804 A | * | 3/1998 | Hack et al. .................. | 438/158 |
| 5,990,489 A | * | 11/1999 | Tashiro .................. | 257/53 |
| 5,990,492 A | * | 11/1999 | Kim .................. | 257/59 |
| 6,140,668 A | * | 10/2000 | Mei et al. .................. | 257/66 |
| 6,184,069 B1 | * | 2/2001 | Wu .................. | 438/155 |
| 6,232,158 B1 | * | 5/2001 | Lee .................. | 438/160 |
| 6,235,561 B1 | * | 5/2001 | Seiki et al. .................. | 438/151 |
| 6,274,400 B1 | * | 8/2001 | Jen .................. | 438/30 |
| 6,436,740 B1 | * | 8/2002 | Jen et al. .................. | 438/149 |
| 2001/0012077 A1 | * | 8/2001 | Choi .................. | 349/43 |
| 2001/0028071 A1 | * | 10/2001 | Yoo et al. .................. | 257/250 |

* cited by examiner

*Primary Examiner*—John F. Niebling
*Assistant Examiner*—Jennifer M. Kennedy
(74) *Attorney, Agent, or Firm*—Ladas & Parry

(57) ABSTRACT

A method to fabricate the TFT of a flat panel display. The method includes four photo etching processes and a back-exposure step. The gate is formed by the first photo etching process. The source and the drain are formed by the second photo etching process. Next, the back-exposure step is performed from the back of the substrate to form an island structure. Then, a protect layer is formed by the third photo etching process. Finally, the pixel electrode is formed by the fourth photo etching process.

11 Claims, 10 Drawing Sheets

METHOD TO FABRICATE FLAT PANEL DISPLAY

BACKGROUND OF THE INVENTION

1. Field of the Invention

The present invention relates in general to a method to fabricate a flat panel display with thin film transistors. In particular, the present invention relates to a liquid crystal display (hereinafter LCD) formed using the light from the back of a substrate for exposure to simplify the fabricating process.

2. Description of the Related Art

The conventional active matrix LCD comprises a plurality of pixel electrodes and switching devices, for example, thin film transistors (hereinafter TFT). The pixels are defined by connected gate lines and data lines. Each pixel comprises a storage capacitor and a pixel electrode connected to the switching devices.

The conventional fabricating process of the TFT of LCD comprises the following steps. First, in FIG. 1A, a first metal film is formed on a transparent substrate 40. Next, a first mask pattern is used to form the gate metal line 42 on the first metal film. Next, in FIG. 1B, an insulating layer 44a is formed on the substrate 40. Next, an amorphous silicon layer 44b is formed on the insulating layer 44a. Next, an n-type doped layer 44c is formed on the amorphous silicon layer 44b. Next, a conductor layer 46 is formed on the n-type doped layer 44c. Next, a photoresist layer 48 is formed on the conductor layer 46. Next, in FIG. 1C, patterns are defined by performing exposure with a second mask and a photo etching process. This step forms an island structure 52 composed of the amorphous silicon layer 44b, the n-type doped layer 44c, and the conductor layer 46 using the photoresist layer 48a on the gate metal line 42. Next, in FIG. 1D, the n-type doped layer 44c and the conductor layer 46 on the gate metal line 42 are removed by performing exposure with a third mask and photo etching process to form a channel 53, the drain electrode 54 and a source electrode 56. Next, a protecting thin-film and a second photoresist layer are formed. In FIG. 1E, a protecting layer 58 is formed by performing exposure with a fourth mask and photo etching process. The protecting layer 58 covers the drain electrode 54, the source electrode 56, the amorphous silicon layer 44b, and the insulating layer 44a. The protecting layer 58 further comprises a plurality of openings (58a, 58b). The drain opening 58a is on the drain electrode 54, and the source opening 58b is on the source electrode 56. Finally, in FIG. 1F, the pixel electrode comprises a drain pixel electrode 62 and a source pixel electrode 64. The drain pixel electrode 62 contacts the drain electrode 54 through the drain opening 58a and the source pixel electrode 64 contacts the source electrode 56 through the source opening 58b.

However, the conventional process requires five performances of photo etching process. The cost and efficiency can be greatly improved if the steps of the photo etching process can be reduced to four.

SUMMARY OF THE INVENTION

To achieve the above-mentioned object, the method to fabricate thin film transistors of a flat panel display comprises the following steps. First, a gate metal line is formed on the substrate. Next, an insulating layer, a semiconductor layer, a doped silicon layer, and a signal metal line are formed on the substrate and the gate metal line. Next, the doped silicon layer and the signal metal line are defined to form a drain electrode and a source electrode, then a channel between the drain electrode and the source electrode is defined. Next, a photoresist layer is formed on the semiconductor layer, the drain electrode, the source electrode, and the channel. Next, the photoresist layer is exposed by the light from the bottom of the substrate, and then the exposed photoresist layer is removed. Then, the semiconductor layer is removed using the remaining photoresist layer as a mask to form an island structure containing the semiconductor layer, the doped silicon layer, the drain electrode, and the source electrode. Next, the photoresist layer is removed and a protecting layer is formed on the insulating layer, the drain electrode, the source electrode, and the semiconductor layer. The protecting layer comprises an opening on the drain electrode or source electrode. Finally, a pixel electrode is formed on the protecting layer, wherein the pixel electrode contacts the drain electrode through the opening.

Further, the method to fabricate thin film transistors of a flat panel display comprises the following steps. First, a gate metal line is formed on the transistor region of the substrate. Next, an insulating layer, a semiconductor layer, a doped silicon layer, and a signal metal line are formed on the gate metal line. Next, the doped silicon layer and the signal metal line are defined to form a drain electrode and a source electrode, and a channel is defined between the drain electrode and the source electrode. Next, a photoresist layer is formed on the semiconductor layer, the drain electrode, the source electrode, and the channel. Next, the photoresist layer is exposed by the light from the bottom of the substrate, then the exposed photoresist layer is removed. Next, the semiconductor layer is removed using the remaining photoresist layer as a mask to form an island structure containing the semiconductor layer, the doped silicon layer, the drain electrode, and the source electrode. Next, the photoresist layer is removed, and a pixel electrode is formed on the insulating layer and the drain electrode, wherein the pixel electrode covers the drain electrode. Finally, a protecting layer is formed on the drain pixel electrode and the insulating layer.

The characteristic of the present invention is that the method to fabricate the TFT of a flat panel display includes four photo etching processes and a single back-exposure step. The gate is formed by the first photo etching process. The source and the drain are formed by the second photo etching process. Next, the exposure is performed from the back of the substrate to form an island structure. Then, a protecting layer is formed by the third photo etching process. Finally, the pixel electrode is formed by the fourth photo etching process.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED INVENTION

First Embodiment

FIGS. 2A–2L are section views illustrating the first embodiment of the present invention. First, in FIG. 2A, a first metal film 12 and a first photoresist layer 11 are formed on a transparent substrate 10. Next, the first photoresist layer 11 is exposed using the first mask pattern. Next, in FIG. 2B, a part of first metal film 12 and the first photoresist layer 11 are removed to form the gate metal line 13.

Figure 1A:
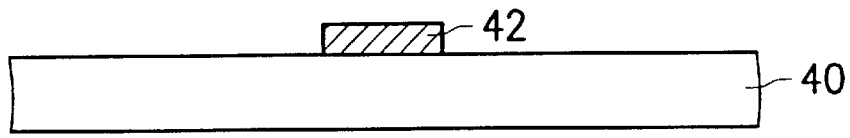
FIGS. 1A–1F are section views illustrating a conventional method of manufacturing a TFT transistor.
Figure 1B:
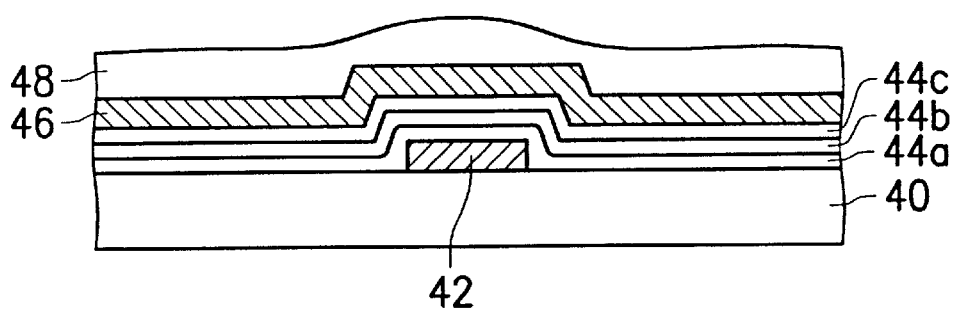
Figure 1C:
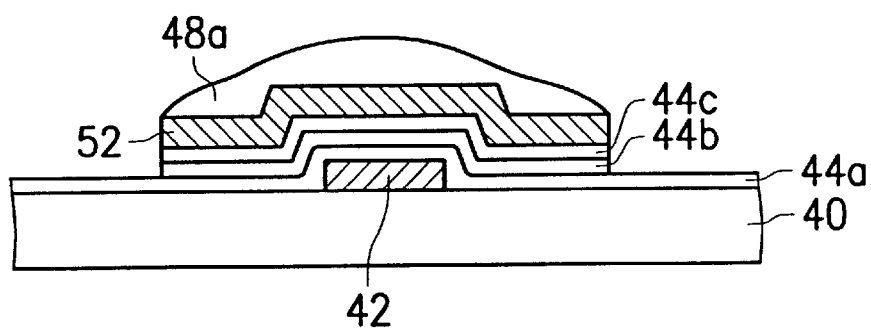
Figure 1D:
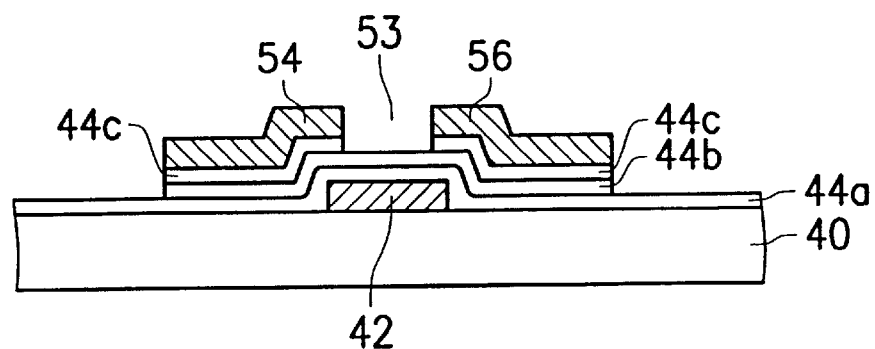
Figure 1E:
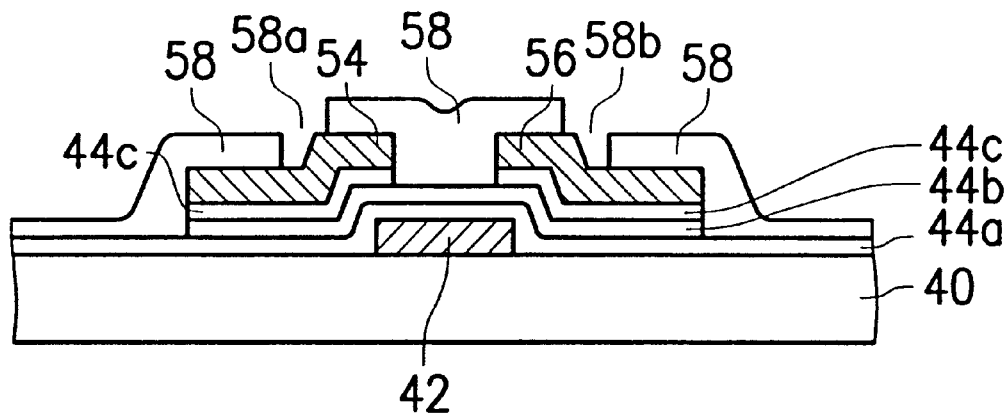
Figure 1F:
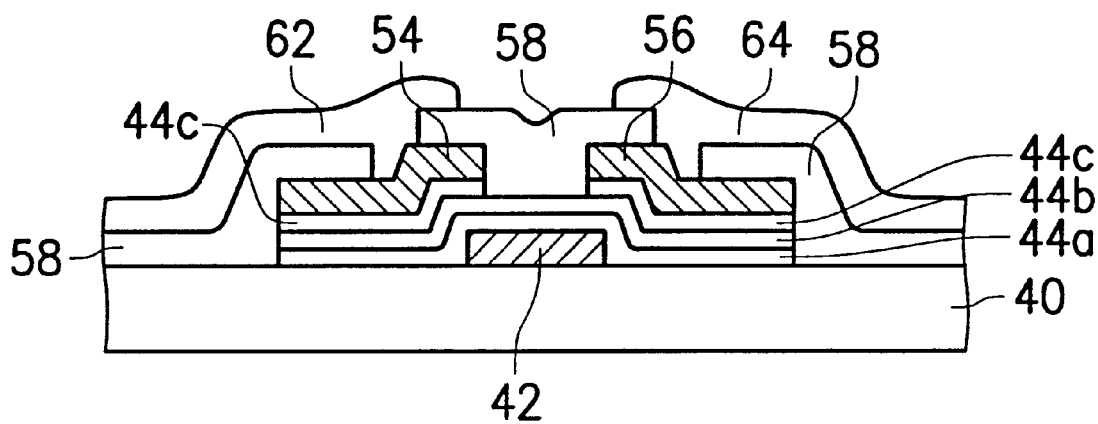
Figure 2A:
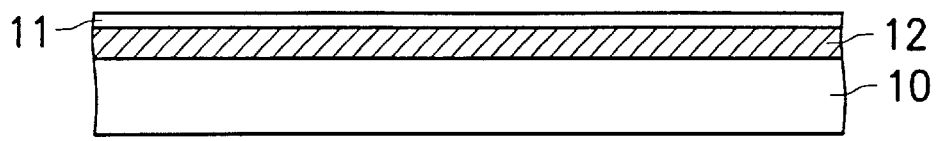
FIGS. 2A–2L are section views illustrating the first embodiment of the present invention.
Figure 2B:
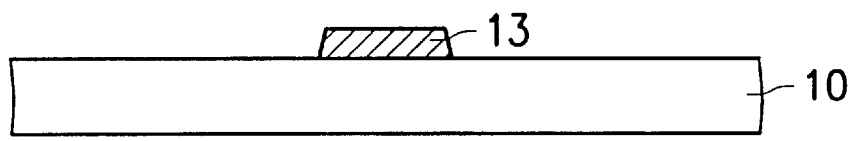
Figure 2C:
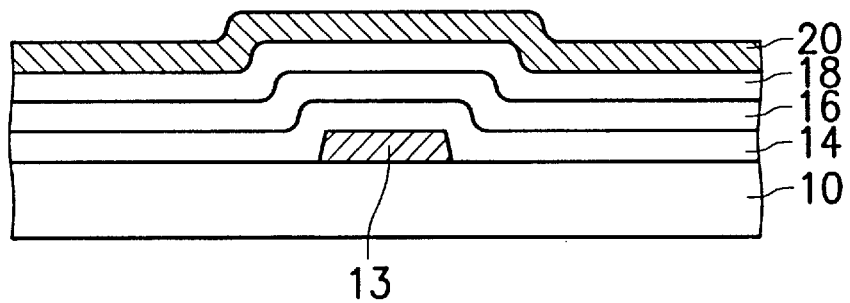

An insulating layer 14 is formed on the substrate 10 and the gate metal line 13, for example, an amorphous silicon nitride layer. In FIG. 2C, a silicon layer 16, a doped layer 18 and a signal metal line 20 are formed on the amorphous silicon nitride layer 14. The silicon layer 16 maybe an amorphous silicon layer, and the doped layer 18 may be an n-type doped amorphous silicon layer.

Figure 2D:
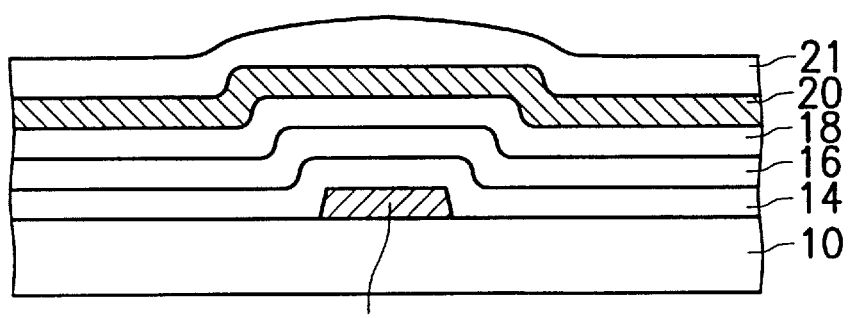
Figure 2E:
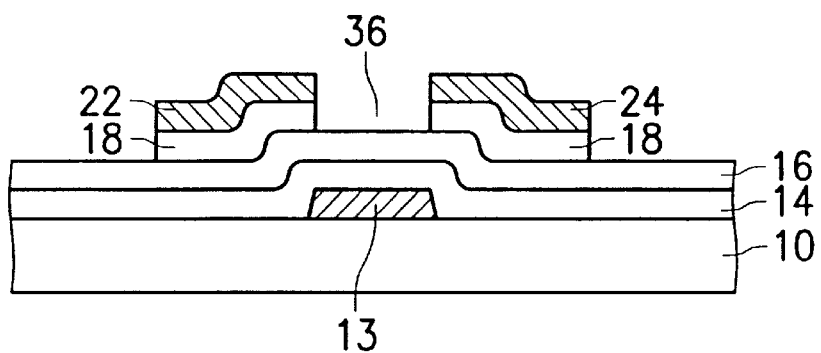

In FIG. 2D, a second photoresist layer 21 is formed on the signal metal line 20. Next, the second photoresist layer 21 is exposed using the second mask pattern. Next, in FIG. 2E, a part of signal metal line 20 and the doped layer 18 are removed to form the drain electrode 22, the source electrode 24 and a channel 36 between the drain electrode 22 and the source electrode 24.

Figure 2F:
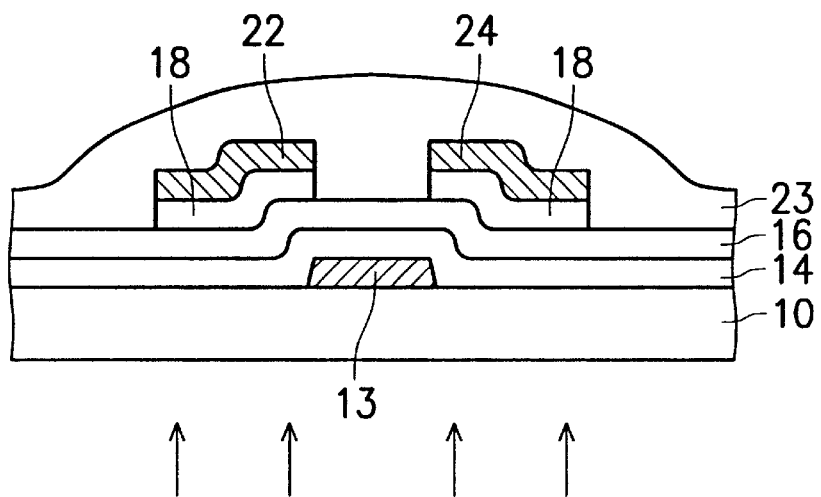
Figure 2G:
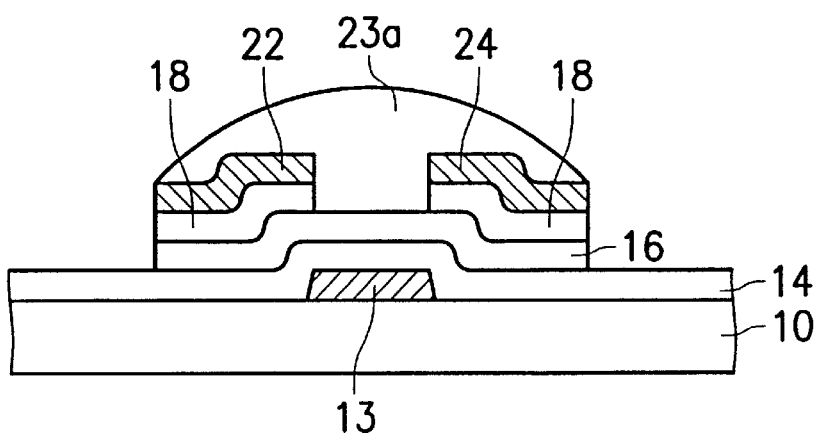
Figure 2H:
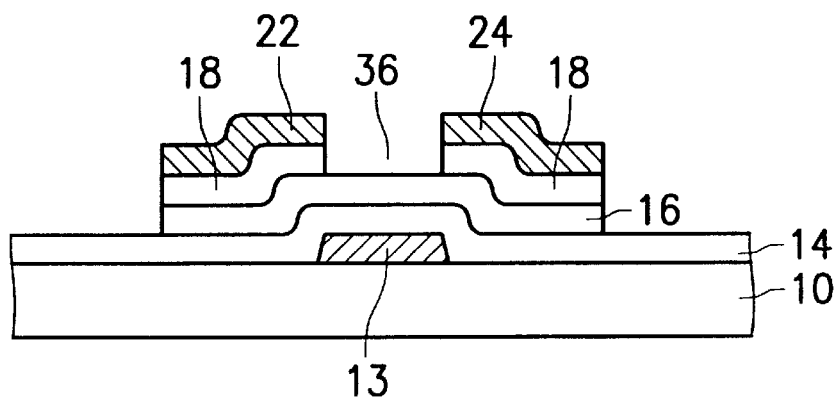

In FIG. 2F, a third photoresist layer 23 is formed on the silicon layer 16, the drain electrode 22 and the source electrode 24. Next, the third photoresist layer 23 is exposed by the light emitted from the bottom of the transparent substrate 10. The gate metal line 13, the drain electrode 22 and the source electrode 24 cover a part of the light, therefore, the third photoresist layer 23 on the gate metal line 13, the drain electrode 22 and the source electrode 24 are not exposed by the light. Next, the third photoresist layer 23 exposed by the light is removed, and the remaining third photoresist layer 23 is used as a mask to remove the silicon layer 16 not covered by the remaining third photoresist layer 23. Therefore, in FIG. 2G, an island structure composed of the silicon layer 16, the doped layer 18, the drain electrode 22 and the source electrode 24 is formed. Next, in FIG. 2H, the remaining third photoresist layer 23 is removed.

Figure 2I:
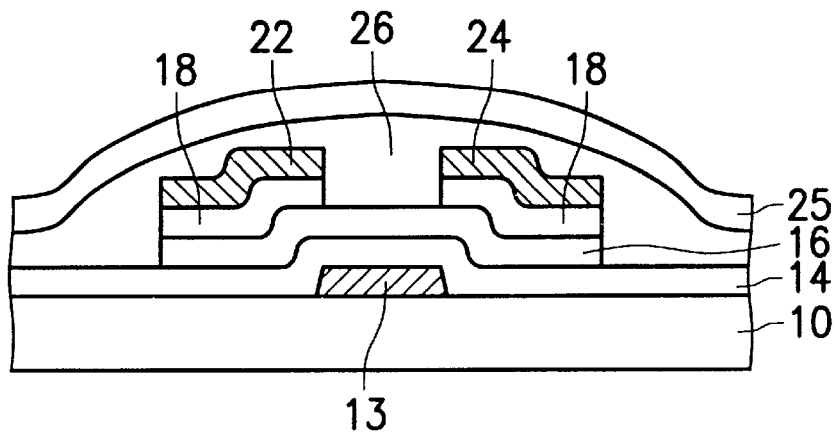
Figure 2J:
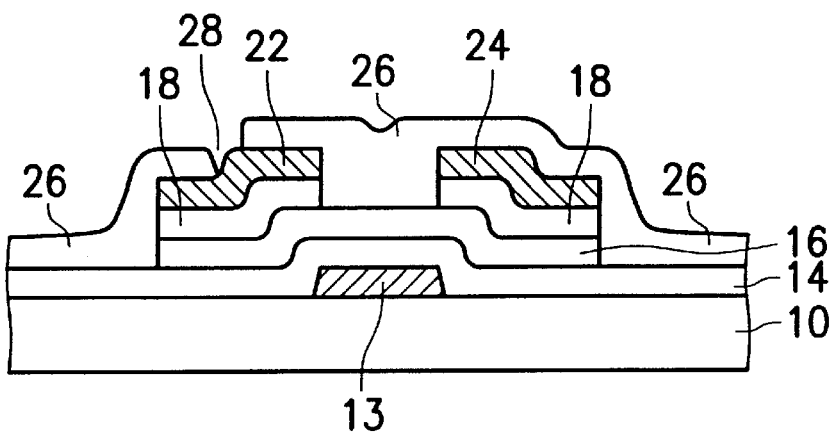
Figure 2K:
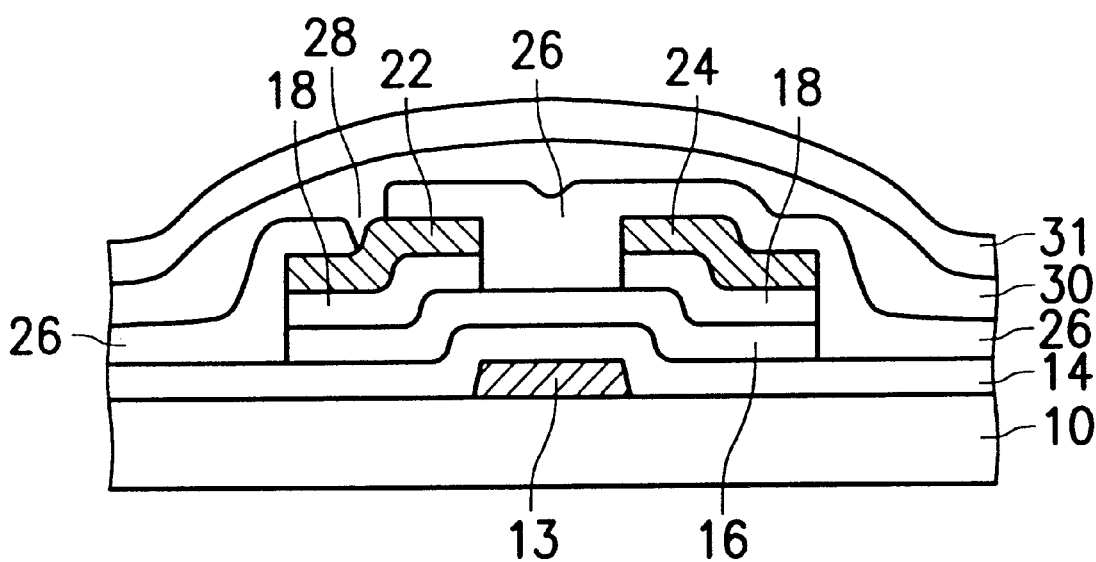
Figure 2L:
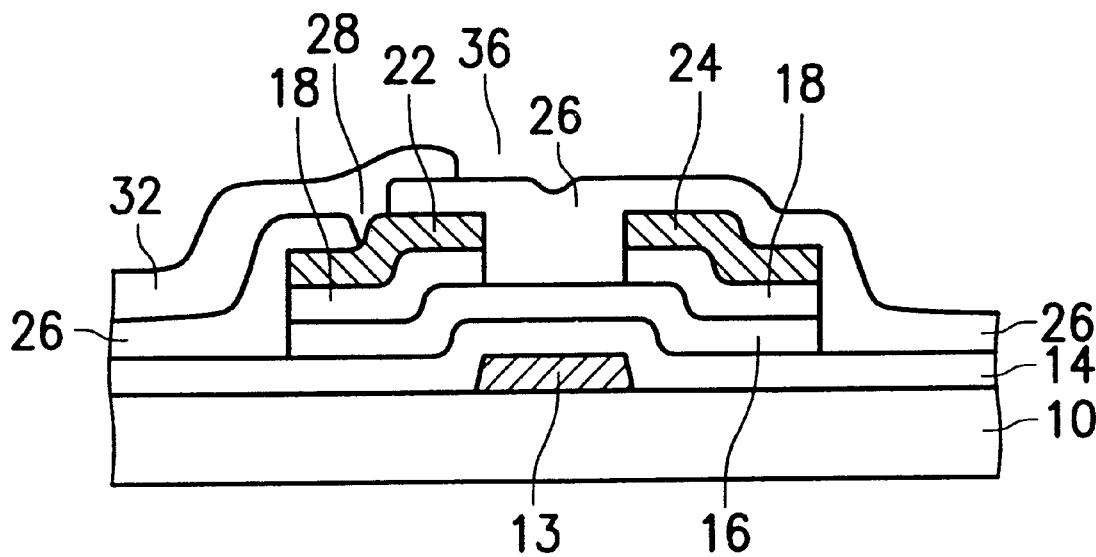

In FIG. 2I, the protecting layer 26 is formed on the silicon nitride layer 14, the drain electrode 22, the source electrode 24 and the silicon layer 16 in the channel 36. A fourth photoresist layer 25 is formed on the protecting layer 26. Next, the fourth photoresist layer 25 is exposed using the third mask pattern. After photo etching process, in FIG. 2J, an opening is formed on the protecting layer 26. For example, the drain opening 28 is formed on the drain electrode 22.

Next, an Indium Tin Oxide layer 30 is formed on the protecting layer 26. Next, in FIG. 2K, a fifth photoresist layer 31 is formed on the Indium Tin Oxide layer 30. Next, the fifth photoresist layer 31 is exposed using the fourth mask pattern to define the Indium Tin Oxide layer 30 to a pixel electrode 32. The pixel electrode 32 contacts the drain electrode 22 through the drain opening 28.

Second Embodiment

FIGS. 3A–3L are section views illustrating the second embodiment of the present invention. The substrate 10 comprises a transistor region and a display region. First, in FIG. 3A, a first metal film 12 and a first photoresist layer 11 are formed on a transparent substrate 10. Next, the first photoresist layer 11 is exposed using the first mask pattern. Next, in FIG. 2B, the metal film 12 and the first photoresist layer 11 are removed to form the gate metal line 13.

Figure 3A:
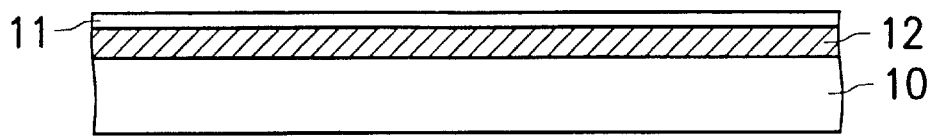
FIGS. 3A–3L are section views illustrating the first embodiment of the present invention.
Figure 3B:
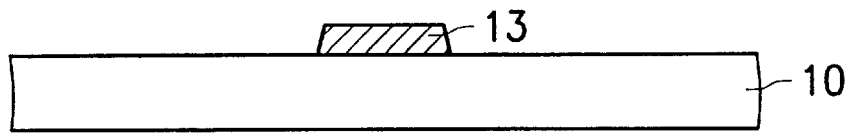
Figure 3C:
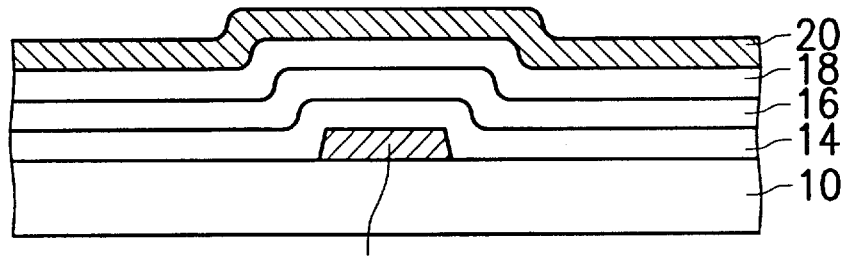

An insulating layer 14 is formed on the substrate 10 and the gate metal line 13. In FIG. 3C, a silicon layer 16, a doped layer 18 and a signal metal line 20 are formed on the amorphous silicon nitride layer 14. The silicon layer 16 may be an amorphous silicon layer, and the doped layer 18 may be an n-type doped amorphous silicon layer.

Figure 3D:
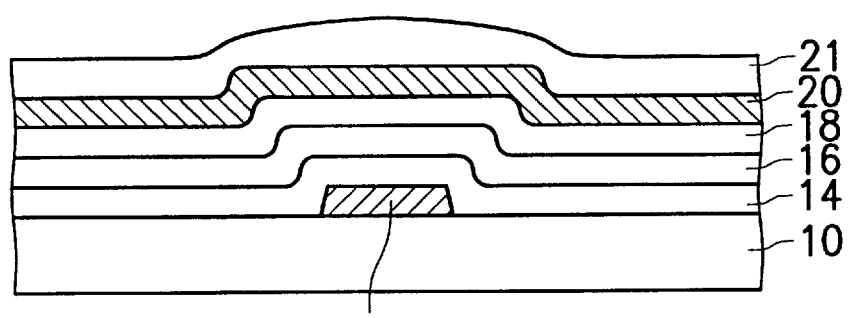
Figure 3E:
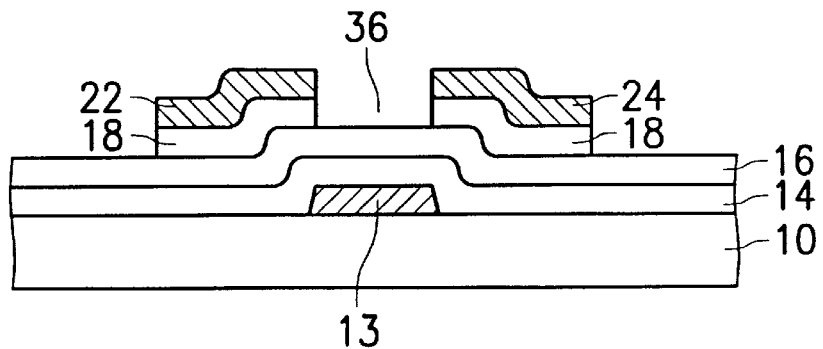

In FIG. 3D, a second photoresist layer 21 is formed on the signal metal line 20. Next, the second photoresist layer 21 is exposed using the second mask pattern. Next, in FIG. 3E, a part of signal metal line 20 and the doped layer 18 are removed to form the drain electrode 22, the source electrode 24 and a channel 36 between the drain electrode 22 and the source electrode 24.

Figure 3F:
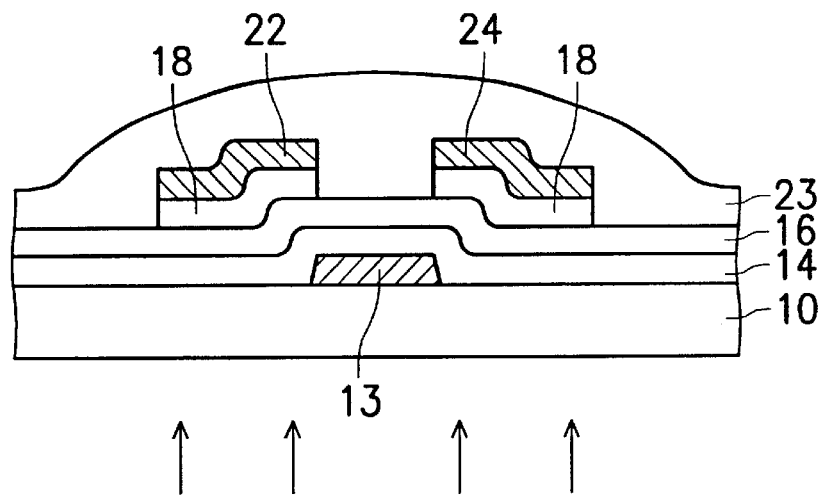
Figure 3G:
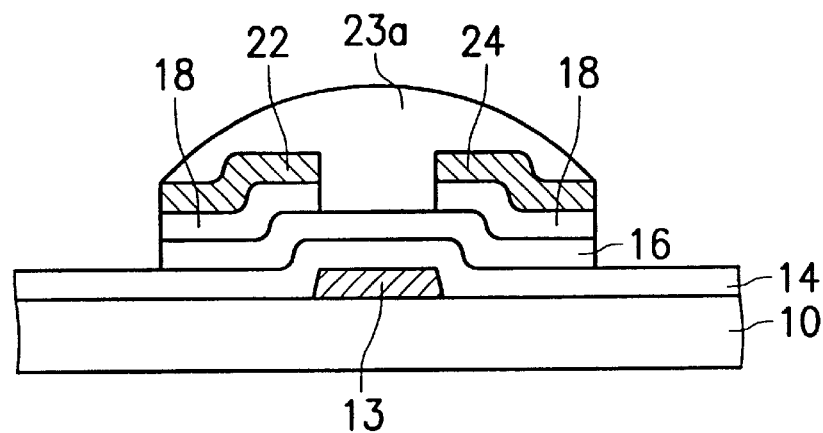
Figure 3H:
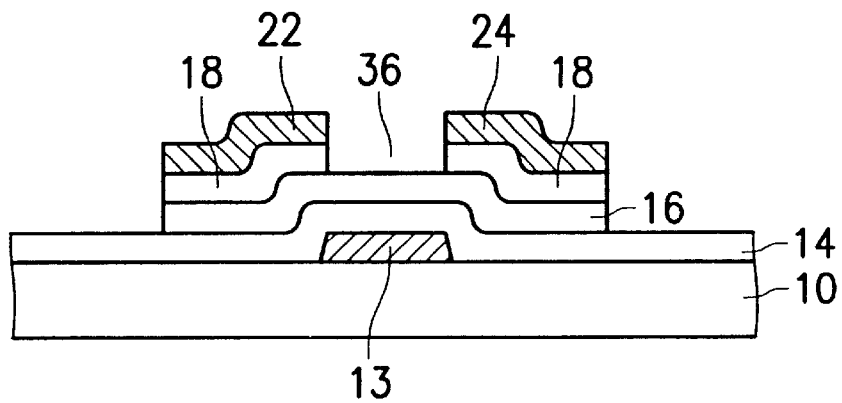
Figure 3I:
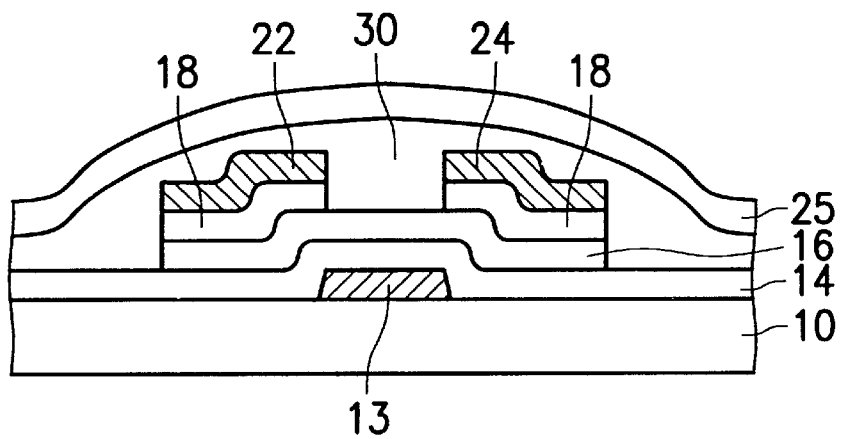
Figure 3J:
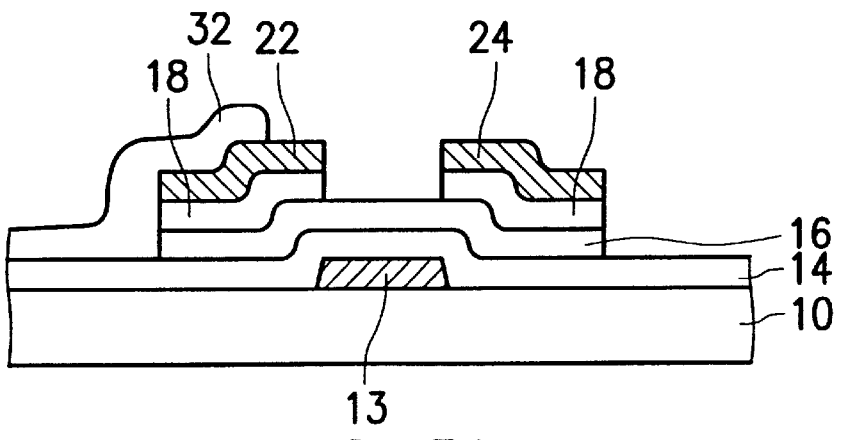
Figure 3K:
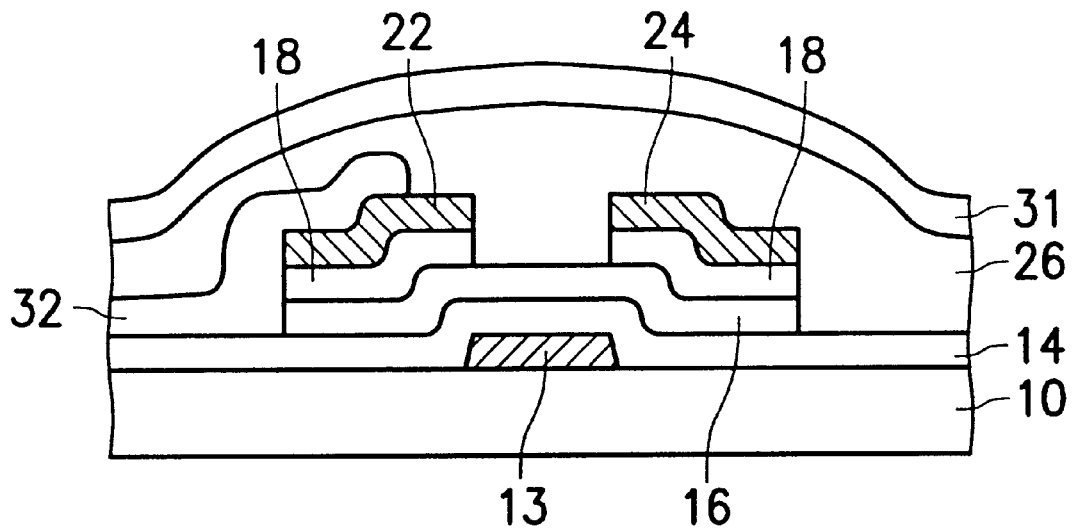
Figure 3L:
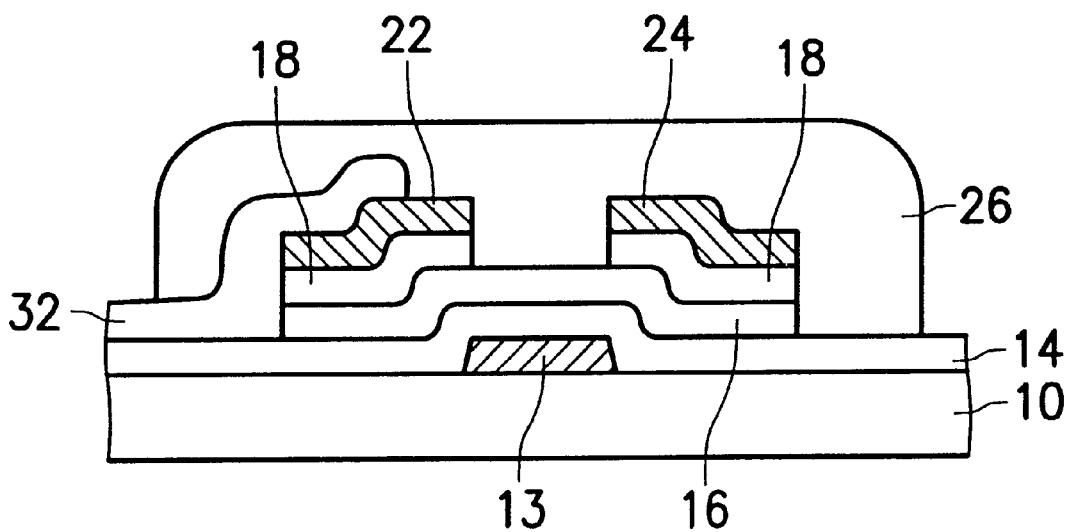

In FIG. 3F, a third photoresist layer 23 is formed on the silicon layer 16, the drain electrode 22 and the source electrode 24. Next, the third photoresist layer 23 is exposed by the light emitted from the bottom of the transparent substrate 10. The gate metal line 13, the drain electrode 22 and the source electrode 24 covers a part of light, therefore, the third photoresist layer 23 on the gate metal line 13, the drain electrode 22 and the source electrode 24 is not exposed by the light. Next, the third photoresist layer 23 exposed by the light is removed, and the remaining third photoresist layer 23 is used as a mask to remove the silicon layer 16 not covered by the remaining third photoresist layer 23. Therefore, in FIG. 2G, an island structure composed of the silicon layer 16, the doped layer 18, the drain electrode 22 and the source electrode 24 is formed. Next, in FIG. 2H, the remaining third photoresist layer 23 is removed.

Next, an Indium Tin Oxide layer 30 is formed on the island structure. Then, in FIG. 3I, a fourth photoresist layer 25 is formed on the Indium Tin Oxide layer 30. Next, the fourth photoresist layer 25 is exposed using the third mask pattern. After photo etching process, in FIG. 3J, a pixel electrode 32 is formed. The pixel electrode 32 contacts the drain electrode 22 and the insulating layer 14. As well, the Indium Tin Oxide layer 30 forms a display region pixel electrode (not shown) in the display region on the substrate 10.

Next, the protecting layer 26 is formed on the pixel electrode 32, the drain electrode 22, the source electrode 24 and the silicon layer 16 in the channel 36. Next, in FIG. 3K, a fifth photoresist layer 31 is formed on the protecting layer 26. Next, the fifth photoresist layer 31 is exposed using the fourth mask pattern to define the protecting layer 26. Therefore, the protecting layer 26 covers the pixel electrode 32, the drain electrode 22, the source electrode 24, the insulating layer 14 and the silicon layer 16. However, the display region pixel electrode in the display region is not covered by the protecting layer 26.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method to fabricate a flat panel display having thin film transistors formed on a substrate, comprising the following steps:

(a) forming a gate metal line on the substrate;
    (b) forming an insulating layer, a semiconductor layer, a doped silicon layer, and a signal metal line on the substrate and the gate metal line;

(c) defining the pattern of the doped silicon layer and the signal metal line to form a drain electrode and a source electrode, and defining a channel between the drain electrode and the source electrode;

(d) forming a photoresist layer on the semiconductor layer, the drain electrode, the source electrode, and the channel;

(e) exposing the photoresist layer by a light emitted from the bottom of the substrate, then removing the exposed photoresist layer, and removing the semiconductor layer using the remaining photoresist layer as a mask to form an island structure containing the semiconductor layer, the doped silicon layer, the drain electrode, and the source electrode;

(f) removing the photoresist layer and forming a protecting layer on the insulating layer, the drain electrode, the source electrode, and the semiconductor layer, wherein the protecting layer comprises an opening on the drain electrode or the source electrode; and (g) forming a pixel electrode on the protecting layer, wherein the pixel electrode contacts the drain electrode through the opening.

2. The method to fabricate a flat panel display as claimed in claim 1, wherein the step (a) comprises the following steps:

forming a metal layer and a first photoresist layer on the substrate; and performing a first photo etching process to form the gate metal line.

3. The method to fabricate a flat panel display as claimed in claim 1, wherein the step (c) comprises performing a second photo etching process to form the drain electrode and the source electrode after forming a second photoresist layer on the doped silicon layer.

4. The method to fabricate a flat panel display as claimed in claim 1, wherein the photoresist layer of the step (d) is a third photoresist layer, and the step (f) comprises the following steps:

forming the protecting layer and a fourth photoresist layer on the insulating layer, the drain electrode, the source electrode, and the semiconductor layer in the channel; and performing a third photo etching process to form the opening.

5. The method to fabricate a flat panel display as claimed in claim 1, wherein the step (g) comprises the following steps:

forming an Indium Tin Oxide layer and a fifth photoresist layer on the protecting layer; and performing a fourth photo etching process to form the pixel electrode.

6. The method to fabricate a flat panel display as claimed in claim 1, wherein the photo etching process is performed four times, which are a first photo etching process to form the gate metal line, a second photo etching process to form the drain electrode and the source electrode, a third photo etching process to form the protecting layer having the opening, and a fourth photo etching process to form the pixel electrode.

7. A method to fabricate a flat panel display having thin film transistors formed on a substrate having a transistor region and a display region, comprising the following steps:

(a) forming a gate metal line on the transistor region of the substrate;

(b) forming an insulating layer, a semiconductor layer, a doped silicon layer, and a signal metal line on the gate metal line;

(c) defining the pattern of the doped silicon layer and the signal metal line to form a drain electrode and a source electrode, and defining a channel between the drain electrode and the source electrode;

(d) forming a photoresist layer on the semiconductor layer, the drain electrode, the source electrode, and the channel;

(e) exposing the photoresist layer by a light emitted from the bottom of the substrate, then removing the exposed photoresist layer, and removing the semiconductor layer using the remaining photoresist layer as a mask to form an island structure containing the semiconductor layer, the doped silicon layer, the drain electrode, and the source electrode;

(f) removing the photoresist layer and forming a pixel electrode on the insulating layer and the drain electrode, wherein the pixel electrode covers the drain electrode; and (g) forming a protecting layer on the pixel electrode, and the insulating layer in the channel.

8. The method to fabricate a flat panel display as claimed in claim 7, wherein the step (a) comprises the following steps:

forming a metal layer and a first photoresist layer on the substrate; and performing a first photo etching process to form the gate metal line.

9. The method to fabricate a flat panel display as claimed in claim 7, wherein the step (c) comprises performing a second photo etching process to form the drain electrode and the source electrode after forming a second photoresist layer on the doped silicon layer.

10. The method to fabricate a flat panel display as claimed in claim 7, wherein the photoresist layer of the step (d) is a third photoresist layer, and the step (f) comprises the following steps:

forming an Indium Tin Oxide layer and a fourth photoresist layer on the substrate; and performing a third photo etching process to form the pixel electrode, and forming a display region pixel electrode in the display region.

11. The method to fabricate a flat panel display as claimed in claim 10, wherein the step (g) comprises the following steps:

forming a silicon oxide layer and a fifth photoresist layer on the substrate; and performing a fourth photo etching process to form the protecting layer on the drain pixel electrode, the source pixel electrode and the channel to expose the display region pixel electrode.

* * * * *